(12) United States Patent
Tseng et al.

(10) Patent No.: US 10,978,122 B1
(45) Date of Patent: Apr. 13, 2021

(54) MEMORY INCLUDING NON-VOLATILE CELLS AND CURRENT DRIVING CIRCUIT

(71) Applicant: UNITED MICROELECTRONICS CORP., Hsin-Chu (TW)

(72) Inventors: Chun-Yen Tseng, Tainan (TW); Yu-Tse Kuo, Tainan (TW); Chang-Hung Chen, Tainan (TW); Shu-Ru Wang, Taichung (TW); Ya-Lan Chiou, Tainan (TW); Chun-Hsien Huang, Tainan (TW); Chih-Wei Tsai, Hsinchu (TW); Hsin-Chih Yu, Hsinchu County (TW); Yi-Ting Wu, Taipei (TW); Cheng-Tung Huang, Kaohsiung (TW); Jen-Yu Wang, Tainan (TW); Jhen-Siang Wu, Kaohsiung (TW); Po-Chun Yang, Tainan (TW); Yung-Ching Hsieh, Tainan (TW); Jian-Jhong Chen, Tainan (TW); Bo-Chang Li, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/796,953

(22) Filed: Feb. 21, 2020

(30) Foreign Application Priority Data

Jan. 7, 2020 (TW) ................................. 109100383

(51) Int. Cl.
*G11C 11/00* (2006.01)
*G11C 11/16* (2006.01)
*H01L 27/22* (2006.01)

(52) U.S. Cl.
CPC ...... *G11C 11/1655* (2013.01); *G11C 11/1657* (2013.01); *G11C 11/1659* (2013.01); *G11C 11/1673* (2013.01); *G11C 11/1675* (2013.01); *H01L 27/226* (2013.01)

(58) Field of Classification Search
CPC ... G11C 2213/79; G11C 11/16; G11C 13/003; G11C 13/0069; G11C 13/0002; G11C 7/06; G11C 11/1659; G11C 11/1673; G11C 13/004; G11C 29/02; G11C 29/026; G11C 29/028; G11C 7/1051; G11C 7/18; H01L 27/24; H01L 27/22; H01L 23/528; H01L 45/00; H01L 27/02; H01L 23/522; H01L 27/105; H01L 27/115; H01L 27/12; H01L 29/66; H01L 29/788; H01L 43/08; H01L 43/10
USPC .. 365/158, 148, 171, 185.21, 210.1, 189.07, 365/207, 209, 173, 185.11, 230.03, 104, 365/107; 1/1
See application file for complete search history.

(56) References Cited

U.S. PATENT DOCUMENTS

8,194,439 B2   6/2012  Kim
9,620,188 B2   4/2017  Manipatruni
2014/0146599 A1  5/2014  Romanovskyy
(Continued)

*Primary Examiner* — Thong Q Le
(74) *Attorney, Agent, or Firm* — Winston Hsu (57) ABSTRACT

A memory includes (n–1) non-volatile cells, (n–1) bit lines and a current driving circuit. Each of the (n–1) non-volatile cells includes a first terminal and a second terminal. An ith bit line of the (n–1) bit lines is coupled to a first terminal of an ith non-volatile cell of the (n–1) non-volatile cells. The current driving circuit includes n first transistors coupled to the (n–1) non-volatile cells.

19 Claims, 10 Drawing Sheets

(56) References Cited

U.S. PATENT DOCUMENTS

2015/0109851 A1     4/2015   Higo
2020/0090722 A1*   3/2020   Lee .................... G11C 11/1675

* cited by examiner

MEMORY INCLUDING NON-VOLATILE CELLS AND CURRENT DRIVING CIRCUIT

BACKGROUND OF THE INVENTION

1. Field of the Invention

The disclosure is related to a memory, and more particularly, a memory including non-volatile cells and a current driving circuit.

2. Description of the Prior Art

With the advancement of storage technology, the demand for memory is becoming higher and higher. Users often expect that a memory can support high-speed operation, non-volatile storage, and has a smaller size. To meet the above requirements, currently there are technical solutions such as magnetoresistive random access memory (MRAM), which can support high-speed and non-volatile access.

However, in practice, some difficulties of the current memory design have been observed. For example, when the circuit area is reduced, the driving current will be insufficient, so the memory unit cannot be properly accessed. If the number of transistors in a driving circuit is increased to improve the driving capability, it will be difficult to simplify the circuit.

Therefore, in order to improve the specifications and performance of the memory, a solution for providing sufficient driving capability without significantly increasing the circuit size is still in need in the field.

SUMMARY OF THE INVENTION

An embodiment provides a memory including (n−1) non-volatile cells, (n−1) bit lines and a current driving circuit. Each of the (n−1) non-volatile cells includes a first terminal and a second terminal. An ith bit line of the (n−1) bit lines is coupled to a first terminal of an ith non-volatile cell of the (n−1) non-volatile cells. The current driving circuit includes n first transistors coupled to the (n−1) first non-volatile cells.

Another embodiment provides a memory including a non-volatile cell, a second non-volatile cell, a first bit line, a second bit line, a first transistor, a second transistor and a third transistor. The first non-volatile cell includes a first terminal and a second terminal. The second non-volatile cell includes a first terminal and a second terminal. The first bit line is coupled to the first terminal of the first non-volatile cell. The second bit line is coupled to the first terminal of the second non-volatile cell. The first transistor includes a first terminal coupled to the second terminal of the first non-volatile cell, a second terminal, and a control terminal. The second transistor includes a first terminal coupled to the second terminal of the second non-volatile cell, a second terminal, and a control terminal. The third transistor includes a first terminal coupled to the first terminal of the first transistor, a second terminal coupled to the first terminal of the second transistor, and a control terminal.

Another embodiment provides a memory including an oxide diffusion layer, a polysilicon layer, a first metal layer, a first non-volatile cell, a second non-volatile cell and a second metal layer. The polysilicon layer is formed above the oxide diffusion layer. The first metal layer is formed above the oxide diffusion layer. The first non-volatile cell is disposed above the oxide diffusion layer and on a first reference line. The second non-volatile cell is disposed above the oxide diffusion layer and on a second reference line in parallel with the first reference line. The second metal layer is formed above the first non-volatile cell and the second non-volatile cell.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
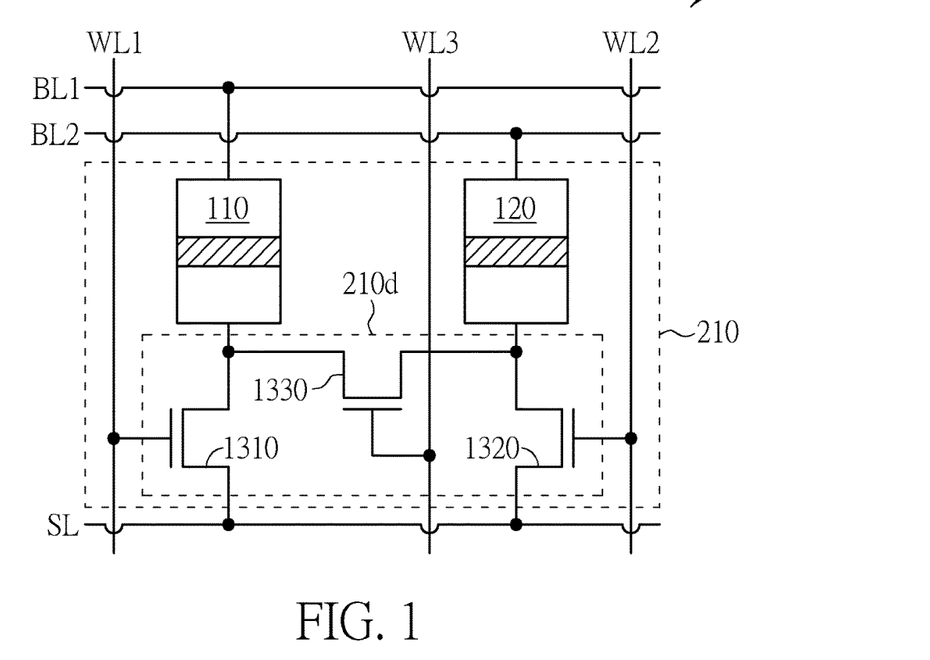
FIG. 1 illustrates a memory according to an embodiment.

FIG. 1 illustrates a memory 100 according to an embodiment. The memory 100 may include a non-volatile cell 110, a non-volatile cell 120, a bit line BL1, a bit line BL2, a transistor 1310, a transistor 1320 and a transistor 1330. The non-volatile cell 110 may include a first terminal and a second terminal. The non-volatile cell 120 may include a first terminal and a second terminal. The bit line BL1 may be coupled to the first terminal of the non-volatile cell 110. The bit line BL2 may be coupled to the first terminal of the non-volatile cell 120. The transistor 1310 may include a first terminal coupled to the second terminal of the non-volatile cell 110, a second terminal, and a control terminal. The transistor 1320 may include a first terminal coupled to the second terminal of the non-volatile cell 120, a second terminal, and a control terminal. The transistor 1330 may include a first terminal coupled to the first terminal of the transistor 1310, a second terminal coupled to the first terminal of the transistor 1320, and a control terminal.

In FIG. 1, the transistors 1310, 1320 and 1330 may form a current driving circuit 210d as described below.

As shown in FIG. 1, the second terminal of the transistor 1310 and the second terminal of the transistor 1320 may be coupled to a source line SL. The control terminal of the transistor 1310 may be coupled to a word line WL1. The control terminal of the transistor 1320 may be coupled to a word line WL2. The control terminal of the transistor 1330 may be coupled to a word line WL3.

According to an embodiment, as shown in FIG. 1, a predetermined voltage V1 may be applied to the bit line BL1. At least one of the transistors 1310, 1320 and 1330 may be turned on to access the non-volatile cell 110.

In the text, accessing a non-volatile cell may include programming (writing) and/or reading the non-volatile cell. Enabling a transistor may include turning on the transistor and setting the transistor conductive. Disabling a transistor may include turning off the transistor and setting the transistor non-conductive.

When the non-volatile cell 110 is being accessed, the bit line BL2 may be float to not access the non-volatile cell 120.

For example, operations of accessing the non-volatile cell 110 of the memory 100 may be as shown in Table 1.

TABLE 1

| Access the non-volatile cell 110 | Program operation | | Read operation |
|---|---|---|---|
| | Write a first value | Write a second value | |
| Voltage(s) applied to the word lines WL1, WL2 and WL3 | Enabling voltage (e.g., the predetermined voltage V1) | | |
| Voltage(s) applied to the bit line BL1 | Enabling voltage (e.g., the predetermined voltage V1) | Reference voltage VSS | Predetermined voltage VL |
| Voltage(s) applied to the bit line BL2 | | floating | |
| Voltage(s) applied to the source line SL | Reference voltage VSS | Enabling voltage (e.g., the predetermined voltage V1) | Reference voltage VSS |

In Table 1, the transistors 1310, 1320 and 1330 are N-type transistors as an example. For example, the predetermined voltage V1 may be 1 volt. A low voltage may be 0.15 volts. The first value and the second value may be complementary to one another; for example, one may be 1, and the other may be 0.

If the transistors 1310 to 1330 are N-type field-effect transistors, for example, the reference voltage VSS may be a ground voltage, and the predetermined voltage VL may be the low voltage.

Figure 4:
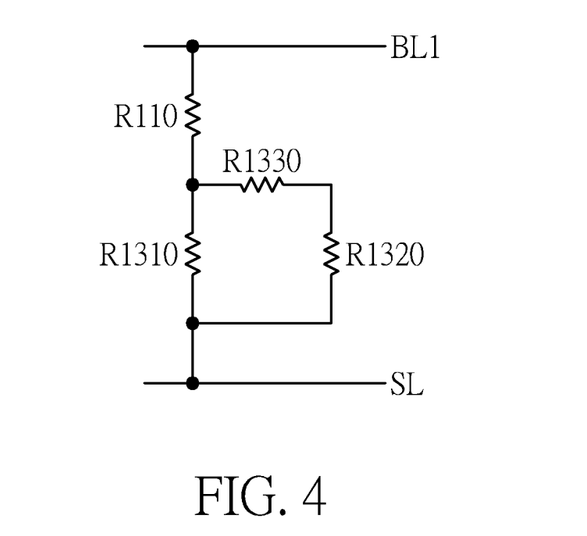
FIG. 4 illustrates an equivalent resistance diagram of a portion of the memory of FIG. 1.

FIG. 1 illustrates a structure including three transistors and two non-volatile cells. In FIG. 1, the non-volatile cells 110 and 120 and the transistors 1310, 1320 and 1330 may form a memory unit 210. The structure of FIG. 1 may be extended as shown in FIG. 4.

Figure 2:
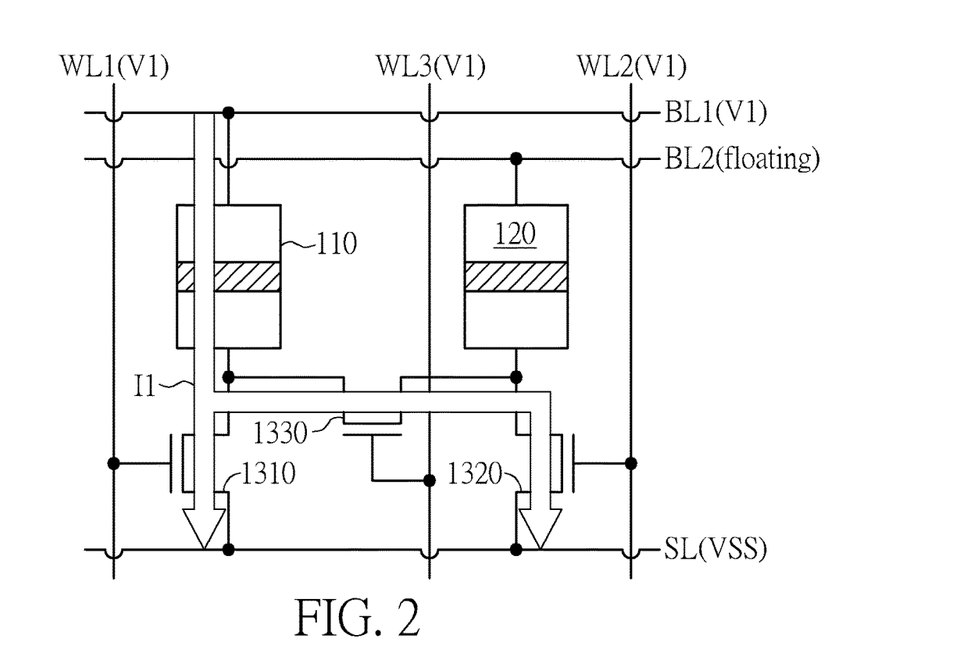
FIG. 2 illustrates that the non-volatile cell of FIG. 1 is being programmed.
Figure 3:
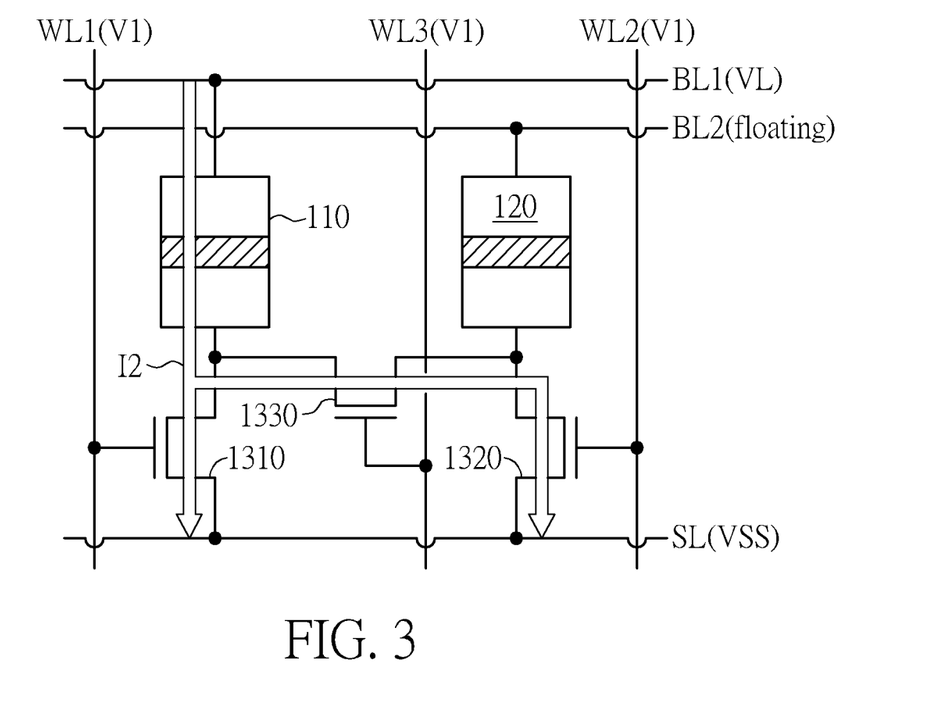
FIG. 3 illustrates that the non-volatile cell of FIG. 1 is being read.

FIG. 2 illustrates that the non-volatile cell 110 of FIG. 1 is being programmed. FIG. 3 illustrates that the non-volatile cell 110 of FIG. 1 is being read.

As described in FIG. 2 and Table 1, when the non-volatile cell 110 is being programmed, the predetermined voltage V1 (e.g., an enabling voltage) may be applied to the word lines WL1, WL2 and WL3 to turn on the transistors 1310, 1320 and 1330. The predetermined voltage V1 may be applied to the bit line BL1 to make the current I1 flow through the non-volatile cell 110 to program the non-volatile cell 110 with the first value (e.g., 1).

As described in FIG. 3 and Table 1, when the non-volatile cell 110 is being read, the predetermined voltage V1 (e.g., an enabling voltage) may be applied to the word lines WL1, WL2 and WL3 to turn on the transistors 1310, 1320 and 1330. The predetermined voltage VL may be applied to the bit line BL1 to make the current I2 flow through the non-volatile cell 110 to read the non-volatile cell 110.

The current I2 may be lower than the current I1. FIG. 2 and FIG. 3 are merely examples. For example, in FIG. 3, voltage(s) applied to word lines WL1, WL2 and WL3 may be adjusted to turn off one or two of the transistors 1310 to 1330 so as to lower the current flowing through the non-volatile cell 110.

In FIG. 2 and FIG. 3, by adjusting and distinguishing the current flowing through the non-volatile cell 110, a program operation and a read operation performed to the non-volatile cell 110 may be distinguished.

FIG. 4 illustrates an equivalent resistance diagram of a portion of the memory 100 of FIG. 1. FIG. 4 may be an equivalent resistance diagram when the non-volatile cell 110 is being accessed. In FIG. 4, the resistors R110, R1310, R1320 and R1330 may respectively be equivalent resistors of the non-volatile cell 110 and transistors 1310, 1320 and 1330. If each of the resistors R1310, R1320 and R1330 has a resistance R, the circuit formed by the resistors R1310, R1320 and R1330 of FIG. 4 may have an equivalent resistance 2R/3.

Hence, resistance of the current driving circuit 210d (formed by the transistors 1310, 1320 and 1330) may be smaller than the resistance (e.g., R) of a current driving circuit formed by a single transistor. Thus, compared with a structure in which a single transistor is used to control a current flowing through a single non-volatile cell, the structure of FIG. 1 may have a better driving capability.

In addition, when using the current driving circuit 210d to control the currents flowing through the non-volatile cells 110 and 120, three transistors are used to control the currents on two non-volatile cells. Hence, the circuit area may be smaller than a circuit area of another condition; in that condition, a current flowing through a single non-volatile cell is controlled by a current driving circuit formed by two transistors, so four transistors are required to control currents flowing through two non-volatile cells.

In other words, using the memory 100 of FIG. 1 may provide a low-resistance current driving circuit to improve the current driving capability and also avoid an excessively large circuit area, improving the current driving capability in a small-sized circuit and the accuracy of accessing a memory.

Figure 5:
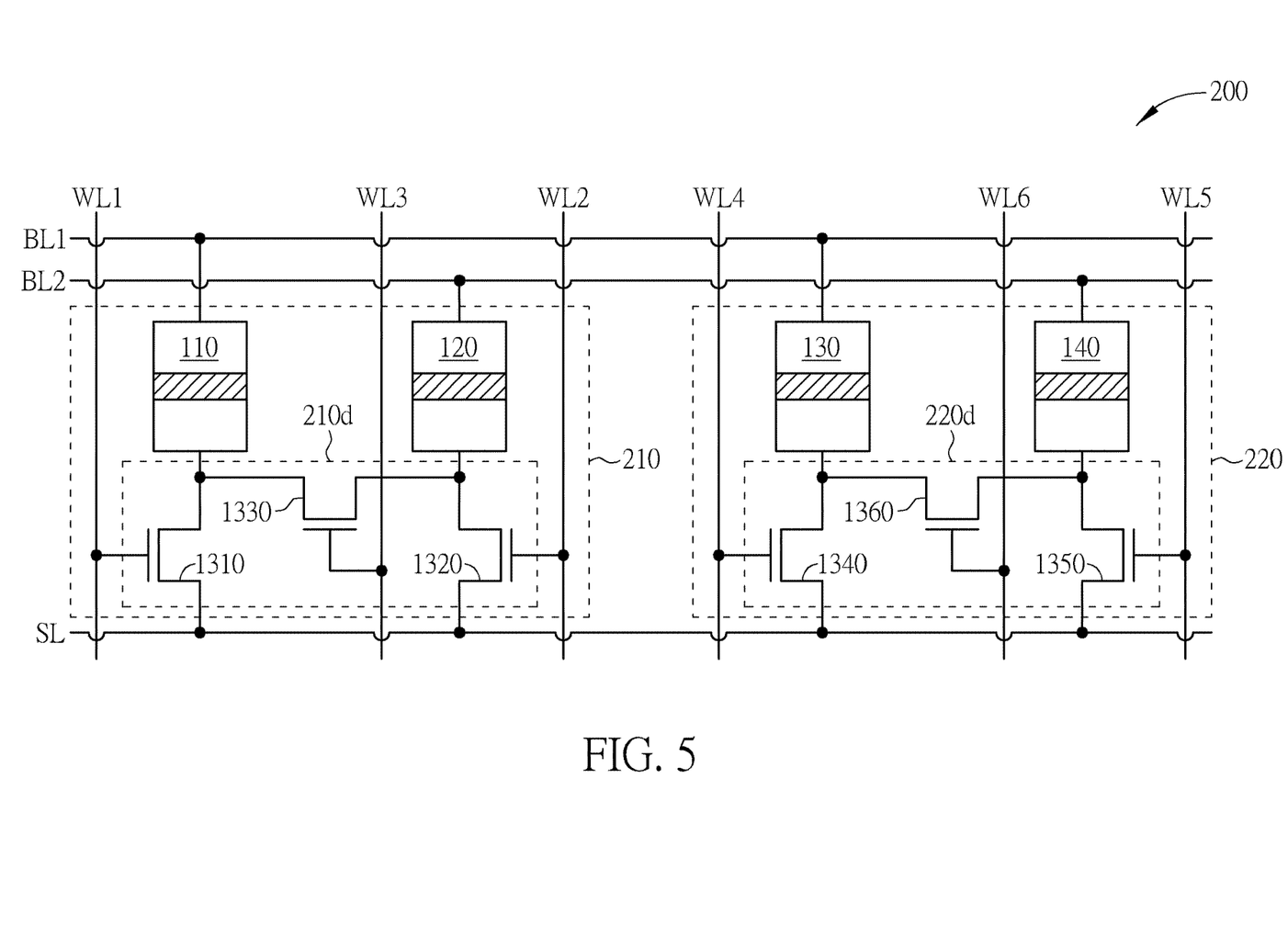
FIG. 5 illustrates a memory according to another embodiment.

FIG. 5 illustrates a memory 200 according to another embodiment. The memory 200 may include the elements shown in FIG. 1 and further include non-volatile cells 130 and 140 and transistors 1340, 1350 and 1360.

As shown in FIG. 5, the non-volatile cell 130 may include a first terminal coupled to the bit line BL1 and a second terminal. The non-volatile cell 140 may include a first terminal coupled to the bit line BL2 and a second terminal.

As shown in FIG. 5, the transistor 1340 may include a first terminal coupled to the second terminal of the non-volatile cell 130, a second terminal, and a control terminal. The transistor 1350 may include a first terminal coupled to the second terminal of the non-volatile cell 140, a second terminal, and a control terminal. The transistor 1360 may include a first terminal coupled to the first terminal of the transistor 1340, a second terminal coupled to the first terminal of the transistor 1350, and a control terminal.

As shown in FIG. 5, the control terminal of the transistor 1340 may be coupled to the word line WL4. The control terminal of the transistor 1350 may be coupled to the word line WL5. The control terminal of the transistor 1360 may be coupled to the word line WL6.

The structure of FIG. 1 may be extended to form the structure of FIG. 5, likewise, the structure of FIG. 5 may be extended to form a larger structure.

In FIG. 5, the non-volatile cells 130 and 140 and the transistors 1340, 1350 and 1360 may form a memory unit 220. The memory unit 220 may be similar to the memory unit 210 described above. The transistors 1340, 1350 and 1360 may form a current driving circuit 220d of the memory unit 220.

In FIG. 5, when one of the non-volatile cells 110 and 120 is being accessed, the transistors 1340, 1350 and 1360 may be turned off. Hence, for example, operations of accessing the non-volatile cell 110 of the memory 200 of FIG. 5 may be shown in Table 2.

TABLE 2

| Access the non-volatile cell 110 | Program operation | | Read operation |
|---|---|---|---|
| | Write a first value | Write a second value | |
| Voltage(s) applied to the word lines WL1, WL2 and WL3 | Enabling voltage (e.g., the predetermined voltage V1) | | |
| Voltage(s) applied to the word lines WL4, WL5 and WL6 | Disabling voltage | | |
| Voltage(s) applied to the bit line BL1 | Enabling voltage (e.g., the predetermined voltage V1) | Reference voltage VSS | Predetermined voltage VL |
| Voltage(s) applied to the bit line BL2 | floating | | |
| Voltage(s) applied to the source line SL | Reference voltage VSS | Enabling voltage (e.g., the predetermined voltage V1) | Reference voltage VSS |

In Table 2, when a negative voltage is applied to the word lines WL4, WL5 and WL6, the transistors 1340, 1350 and 1360 may be better turned off to reduce problems such as leakage current or program disturbance.

If the transistors in FIG. 5 are N-type transistors, the disabling voltage in Table 2 may be a ground voltage or a negative voltage.

In Table 1 and Table 2, the condition of accessing the non-volatile cell 110 is mentioned as an example. When the non-volatile cell 120 is being accessed, the bit line BL1 may be kept float, and the enabling voltage, the reference voltage VSS or the predetermined voltage VL may be applied to the bit line BL2 to respectively program the first value to the non-volatile cell 120, program the second value to the non-volatile cell 120 or read the non-volatile cell 120. In other words, the operations of accessing the non-volatile cell 120 and accessing the non-volatile cell 110 may be similar.

As shown in FIG. 1 and FIG. 5, each memory unit (e.g., each of 210 and 220) may include two non-volatile cells such as (but not limited to) two magnetic tunnel junction (MTJ) cells, two resistive random-access memory (RRAM) cells or two phase-change cells.

As shown in FIG. 1 and FIG. 5, the current driving circuit 210d may be used to control the currents flowing through the non-volatile cells 110 and 120, and the current driving circuit 210d may include three transistors. Therefore, each of the memories shown in FIG. 1 and FIG. 5 may have a memory structure corresponding to three transistors and two non-volatile cells. If a transistor is denoted as T, and a non-volatile cell is denoted as M, each of the structures shown in FIG. 1 and FIG. 5 may be called as a 3T2M structure.

Figure 6:
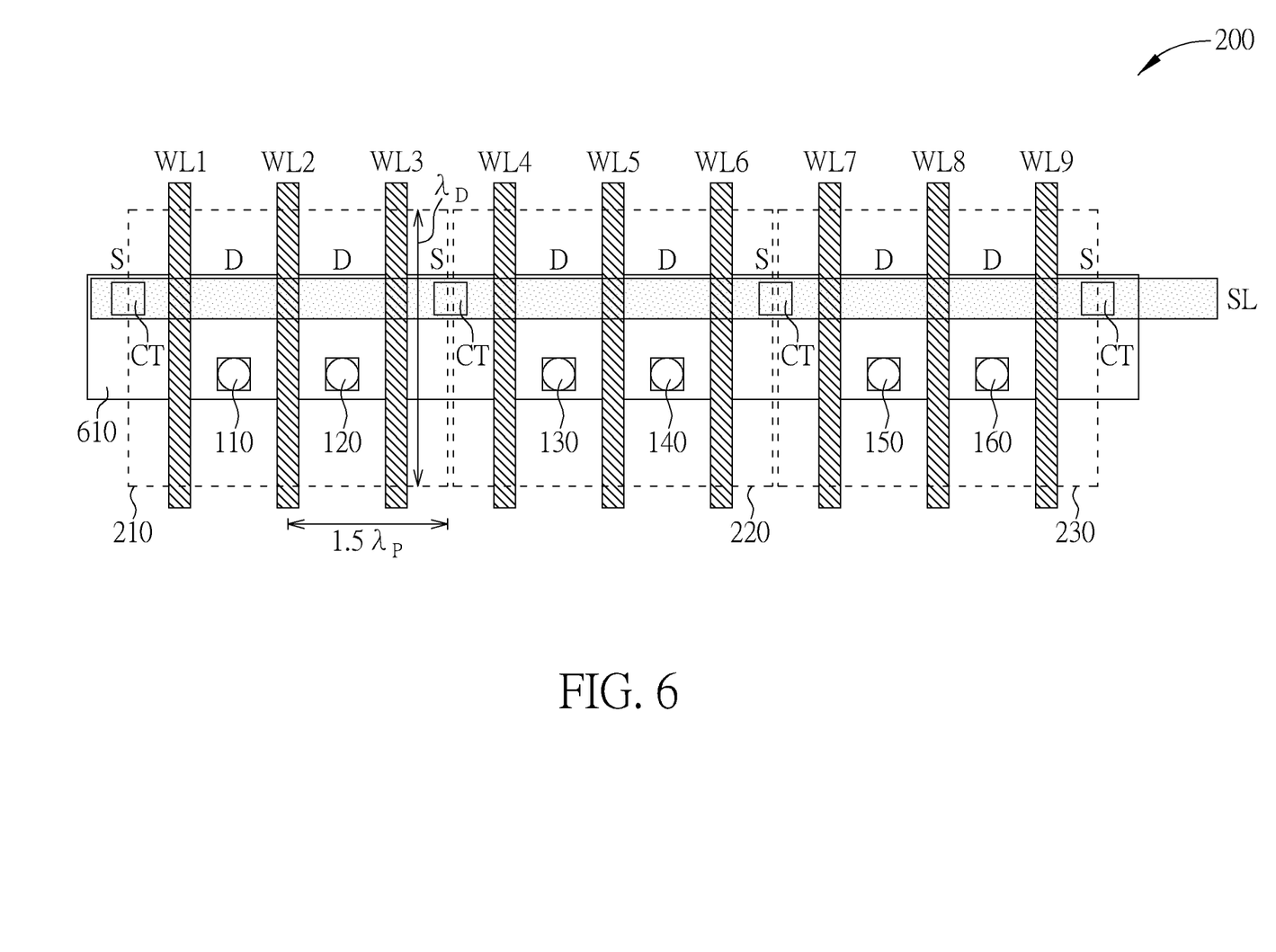
FIG. 6 illustrates a layout of the memory of FIG. 5.

FIG. 6 illustrates a layout of the memory 200 of FIG. 5. FIG. 6 may be a top view of a 3T2M structure mentioned above. In FIG. 6, a region S may be corresponding to a source terminal of a transistor. A region D may be corresponding to a drain terminal of a transistor. Taking an N-type transistor as an example, a source terminal and a drain terminal may be the first terminal and the second terminal of the transistor. In FIG. 6, a layer 610 may be an oxide diffusion (OD) layer. The layouts of the memory units 210 and 220 may be shown as FIG. 6. In FIG. 6, each transistor may be coupled to the source line SL through a contact layer CT.

As mentioned above, the structure of FIG. 5 may be extended to form a larger memory structure. Hence, like the memory unit 220, the memory 200 may further include a memory unit 230 as shown in FIG. 6. The memory unit 230 may include non-volatile cells 150 and 160. A current driving circuit formed by three transistors may be used to control currents flowing through the non-volatile cells 150 and 160, and the three transistors may be turned on or turned off by means of word lines WL7, WL8 and WL9.

In FIG. 6, the non-volatile cells 110, 130 and 150 may be coupled to the bit line BL1 of FIG. 5. The non-volatile cells 120, 140 and 160 may be coupled to the bit line BL2 of FIG. 5.

In other words, in each memory cell of FIG. 1, FIG. 5 and FIG. 6, a first non-volatile cell may be coupled to the bit line BL1, and a second non-volatile cell may be coupled to the bit line BL2.

Taking FIG. 6 as an example, when the memory unit 220 is to be accessed, the disabling voltage may be applied to the word lines WL1 to WL3 and WL7 to WL9, and the enabling voltage may be applied to the word lines WL4 to WL6 so as to access the memory unit 220 without accessing the memory units 210 and 230. In addition, by setting voltages applied to the bit lines BL1 and BL2, the non-volatile cell 130 or 140 may be further accessed.

As shown in FIG. 6, a region corresponding to a non-volatile cell may have a width of $1.5\lambda_P$ and a length $\lambda_D$, so an area corresponding to a non-volatile cell may be $1.5\lambda_P\lambda_D$. As mentioned above, the structure shown in FIG. 6 may be called as a 3T2M structure. A structure using a single transistor to control a current flowing through a single non-volatile cell may be called as a 1T1M structure. A structure using two transistors to control a current flowing through a single non-volatile cell may be called as a 2T1M structure. In Table 3, the three types of structures may be compared.

TABLE 3

| | Area corresponding to each non-volatile cell | Current | Note |
|---|---|---|---|
| 1T1M structure | $1.5\ \lambda_P\lambda_D$ | 1 unit | Lower current |
| 2T1M structure | $2\ \lambda_P\lambda_D$ | 2 units | Larger Area |
| 3T2M structure | $1.5\ \lambda_P\lambda_D$ | 1.5 units | Balanced current and area |

In Table 3, the currents of the structures are different because the equivalent resistances of the current driving circuits are different. As shown in Table 3, current and area may be balanced by means of the 3T2M structure show in FIG. 1 and FIG. 6.

After comparing the abovementioned 1T1M structure and 2T1M structure with the 3T2M structure of an embodiment, the 3T2M structure may provide the largest driving current under the same area. In addition, regarding manufacture process, the tolerance for scaling down the 3T2M structure may be close to that of the 1T1M structure and better than that of the 2T1M structure. Hence, a 3T2M structure provided by an embodiment may have a better scalability.

In FIG. 1 to FIG. 6, the 3T2M structures are examples for describing the principle of embodiments, but embodiments are not limited thereto.

Figure 7:
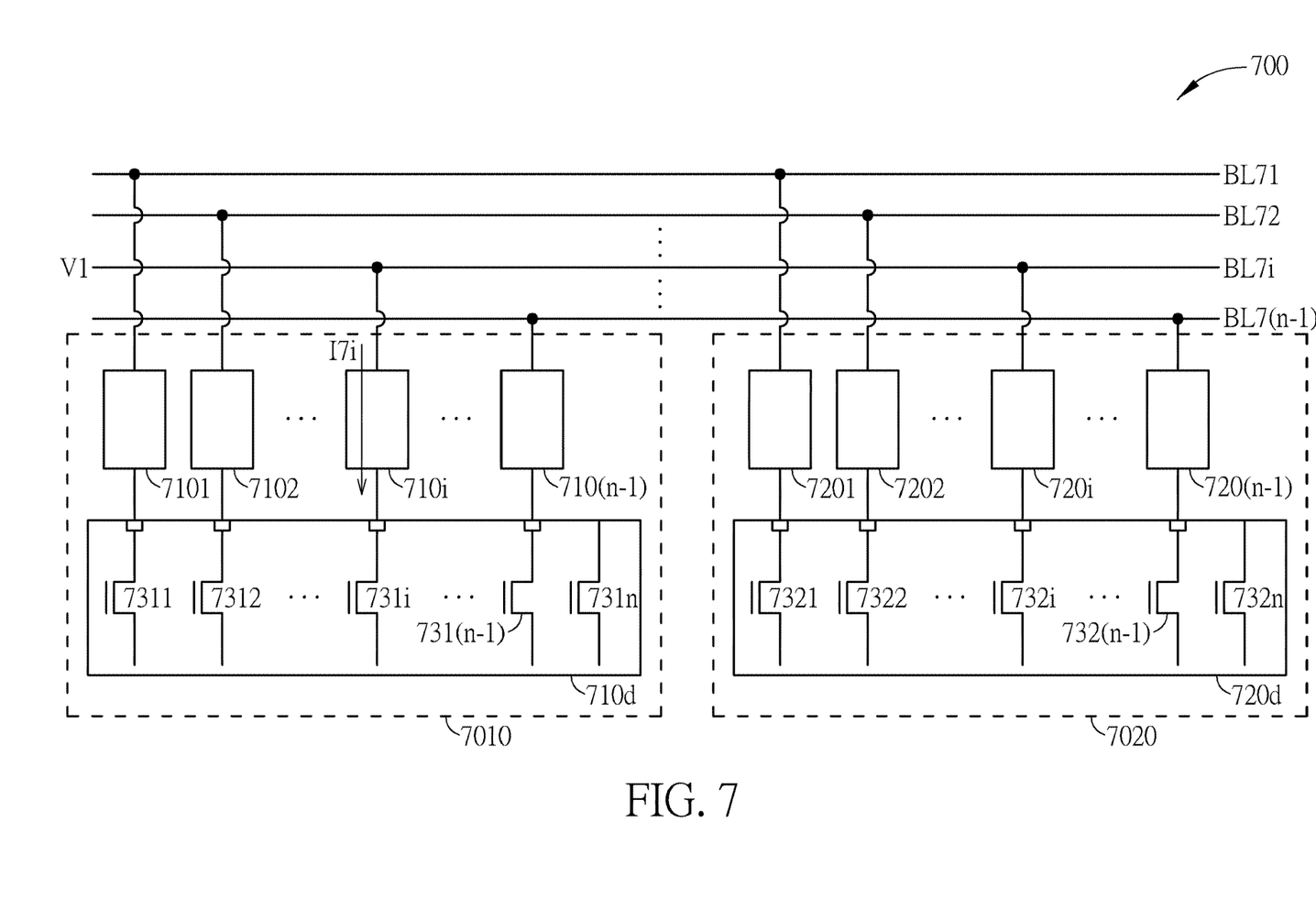
FIG. 7 illustrates a memory according to another embodiment.

FIG. 7 illustrates a memory 700 according to another embodiment. The memory 700 may include (n−1) non-volatile cells 7101 to 710(n−1), (n−1) bit lines BL71 to BL7(n−1) and a current driving circuit 710d. As shown in FIG. 7, each of the (n−1) non-volatile cells may include a first terminal and a second terminal. An ith bit line BL7i of the (n−1) bit lines BL71 to BL7(n−1) may be coupled to a first terminal of an ith first non-volatile cell 710i of the (n−1) first non-volatile cells 7101 to 710(n−1). The current driving circuit 710d may include n transistors 7311 to 731n coupled to the (n−1) non-volatile cells 7101 to 710(n−1). n and i are positive integers, n>2, and i<n. As shown in FIG. 7, n transistors may be used to control currents flowing through (n−1) non-volatile cells, so the structure of FIG. 7 may be called as an nT(n−1)M structure as described above.

The (n−1) non-volatile cells 7101 to 710(n−1) in FIG. 7 may be (n−1) magnetic tunnel junction (MTJ) cells, (n−1) resistive random-access memory (RRAM) cells or (n−1) phase-change cells.

In FIG. 7, each of the n transistors 7101 to 710n may have a first terminal, a second terminal and a control terminal. A first terminal of an ith transistor 731i of the n transistors 7311 to 731n may be coupled to a second terminal of an ith non-volatile cell 710i. The structure of FIG. 7 may merely be an example instead of limiting the scope of embodiments.

The predetermined voltage V1 may be applied to an ith bit line BL7i. The current driving circuit 710d may be operated for a predetermined current I7i to flow through the ith non-volatile cell 710i to access the ith non-volatile cell 710i. As described in Table 1 and Table 2, the predetermined current I7i has a higher value when the ith non-volatile cell 710i is being written and a lower value when the ith non-volatile cell 710i is being read.

As shown in FIG. 7, the memory 700 may further include (n−1) non-volatile cells 7201 to 720(n−1) and a current driving circuit 720d. Each of the (n−1) non-volatile cells 7201 to 720(n−1) may include a first terminal and a second terminal. The ith bit line BL7i may further be coupled to a first terminal of an ith non-volatile cell 720i of the (n−1) non-volatile cells 7201 to 720(n−1). The current driving circuit 720d may include n transistors 7321 to 732n coupled to the (n−1) non-volatile cells 7201 to 720(n−1).

As shown in FIG. 7, the non-volatile cells 7101 to 710(n−1) and the current driving circuit 710d may form a memory unit 7010. The non-volatile cells 7201 to 720(n−1) and the current driving circuit 720d may form a memory unit 7020. The memory units 7010 and 7020 may have a similar structure. FIG. 7 merely provides an example, and the memory 700 may include more memory units.

In FIG. 7, the n transistors 7321 to 732n of the current driving circuit 720d may be turned off when one of the (n−1) non-volatile cells 7101 to 710(n−1) is being accessed to avoid erroneous programing and reduce programing disturbance.

Figure 8:
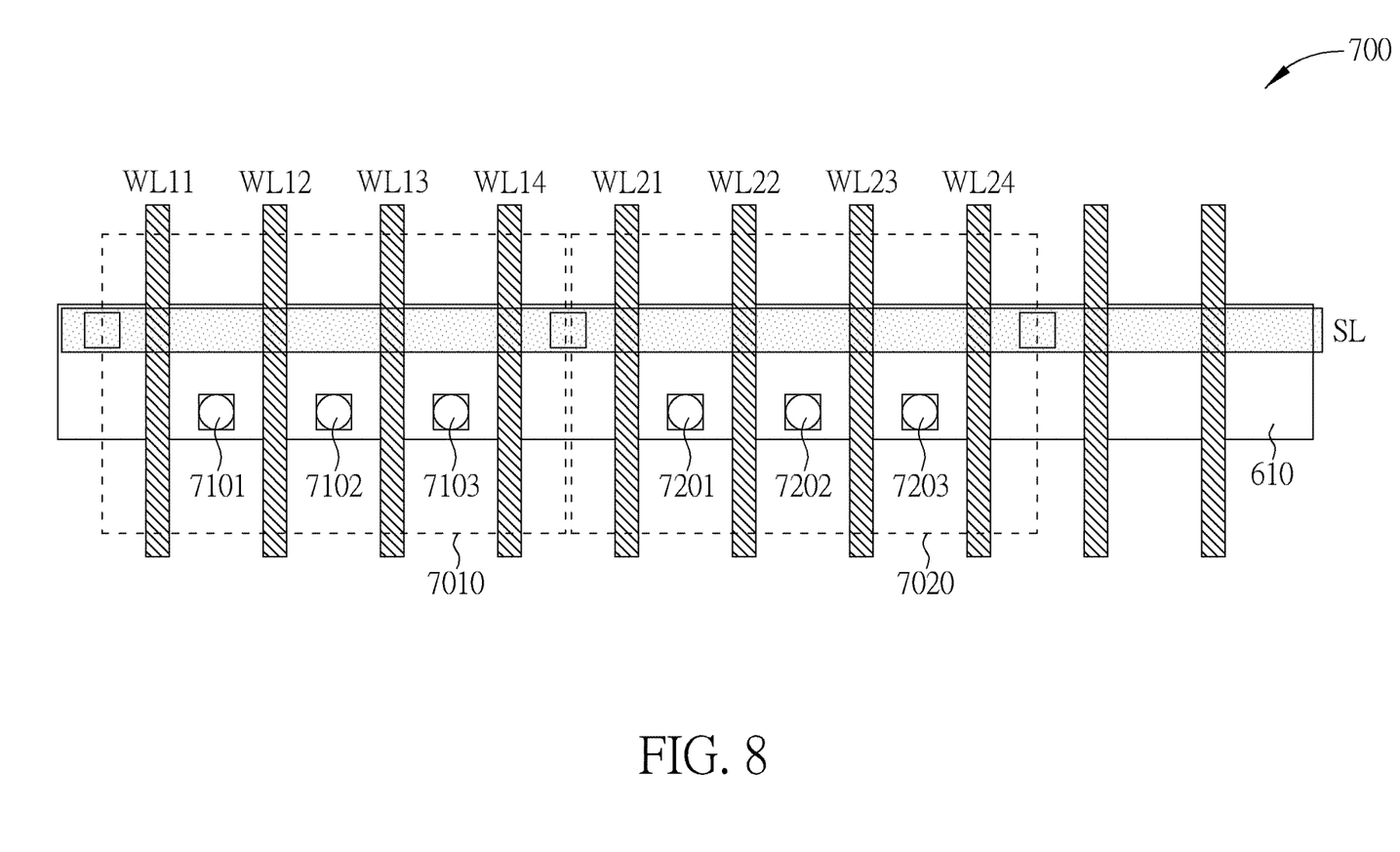
FIG. 8 illustrates a layout of a 4T3M structure according to an embodiment.

FIG. 8 illustrates a layout of a 4T3M structure according to an embodiment. The 4T3M structure may include a memory unit where four transistors form a current driving circuit to control currents flowing through three non-volatile cells. FIG. 8 may be a top view. FIG. 8 may be a case of FIG. 7 where n=4. As shown in FIG. 8, the word lines WL11 to WL14 may be respectively coupled to four control terminals of four transistors of the current driving circuit 710d (shown in FIG. 7) of the memory unit 7010. The word lines WL21 to WL24 may be respectively coupled to four control terminals of four transistors of the current driving circuit 720d (shown in FIG. 7) of the memory unit 7020.

Figure 9:
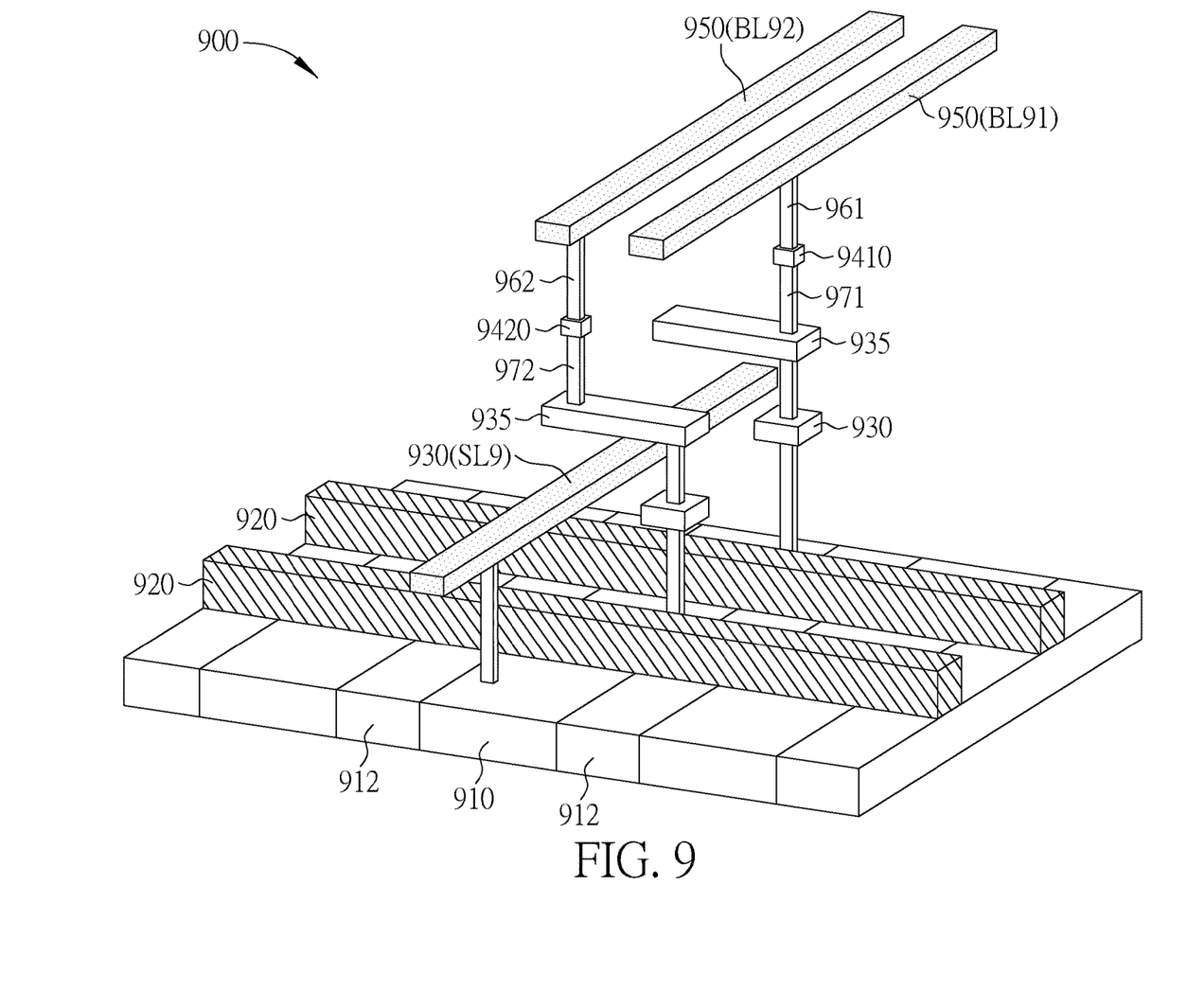
FIG. 9 illustrates a memory according to an embodiment.

FIG. 9 illustrates a memory 900 according to an embodiment. FIG. 9 is a perspective view of the memory in FIG. 1 and FIG. 7 during a manufacture process. Hence, the memory 900 may be the foresaid memory 100 or 700. FIG. 9 is merely an example instead of limiting the sequence of layers of a memory from bottom to top. The sequence of the layers from bottom to top may be reasonably adjusted.

The memory 900 may include an oxide diffusion layer 910, a polysilicon layer 920, a metal layer 930, non-volatile cells 9410 and 9420 and a metal layer 950.

Figure 10:
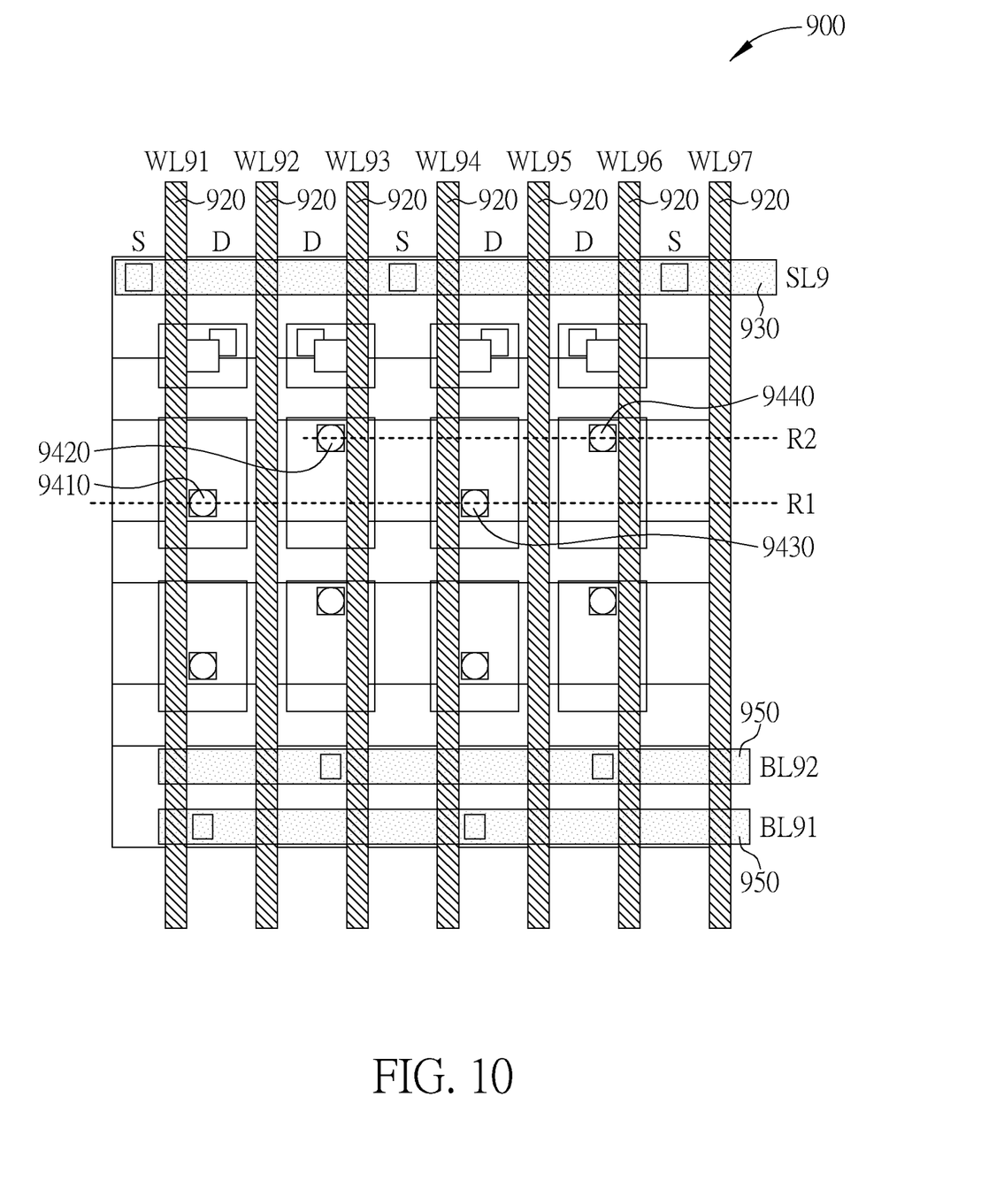
FIG. 10 illustrates a layout of the memory of FIG. 9.

The polysilicon layer 920 may be formed above the oxide diffusion layer 910. The metal layer 930 may be formed above the oxide diffusion layer 910. The metal layer 950 may be formed above the non-volatile cells 9410 and 9420. The non-volatile cell 9410 may be disposed above the oxide diffusion layer 910 and on a first reference line R1. The non-volatile cell 9420 may be disposed above the oxide diffusion layer 910 and on a second reference line R2. The reference lines R1 and R2 may be in parallel with one another as shown in FIG. 10.

Taking FIG. 1 as an example, the non-volatile cells 9410 and 9420 of FIG. 9 may be respectively corresponding to the non-volatile cells 110 and 120 of FIG. 1.

In the memory 900, a first terminal and a second terminal (e.g., a source terminal and a drain terminal) of each transistor may be formed on the oxide diffusion layer 910. As shown in FIG. 9, a shallow trench isolation (STI) layer 912 may be formed on the oxide diffusion layer 910. Word lines (e.g., the word lines WL1 to WL3 of FIG. 1) of the memory 900 may be formed on the polysilicon layer 920. A source line SL9 (e.g., the source line SL of FIG. 1) of the memory 900 may be formed on the metal layer 930. Bit lines BL91 and BL92 (e.g., the bit lines BL1 and BL2 of FIG. 1) may be formed on the metal layer 950.

As shown in FIG. 9, the memory 900 may further include vias 961 and 962.

The via 961 may be formed between the metal layer 950 and the non-volatile cell 9410 and used to electrically connect the bit line BL91 and the non-volatile cell 9410. The via 962 may be formed between the metal layer 950 and the non-volatile cell 9420 and used to electrically connect the bit line BL92 and the non-volatile cell 9420.

As shown in FIG. 9, the memory 900 may further include a metal layer 935 to provide a platform for disposing the non-volatile cells 9410 and 9420. The memory 900 may further include vias 971 and 972 respectively formed between the non-volatile cell 9410 and the metal layer 935 and between the non-volatile cell 9420 and the metal layer 935. The vias 971 and 972 may be (but not limited to) tungsten vias.

The non-volatile cells 9410 and 9420 of FIG. 9 may be two magnetic tunnel junction cells, two resistive random-access memory cells, or two phase-change cells.

FIG. 10 illustrates a layout of the memory 900 of FIG. 9. The operation principles of FIG. 10 may be similar to that of FIG. 6, but FIG. 10 provides a different layout. As shown in FIG. 10, the word lines WL91, WL92 and WL93 may be used to control three transistors, and the three transistors may be used to control currents flowing through the non-volatile cells 9410 and 9420. The non-volatile cells 9410 and 9420 may be in the same memory unit.

As shown in FIG. 10, the memory 900 may further include non-volatile cells 9430 and 9440. The non-volatile cells 9430 and 9440 may be in the same memory unit. The non-volatile cell 9430 may be coupled to the bit line BL91 and be disposed above the oxide diffusion layer 910 and on the reference line R1. The non-volatile cell 9440 may be coupled to the bit line BL92 and be disposed above the oxide diffusion layer 910 and on the reference line R2. Hence, according to the example of FIG. 9 and FIG. 10, non-volatile cells in a memory may be placed in stagger.

Figure 11:
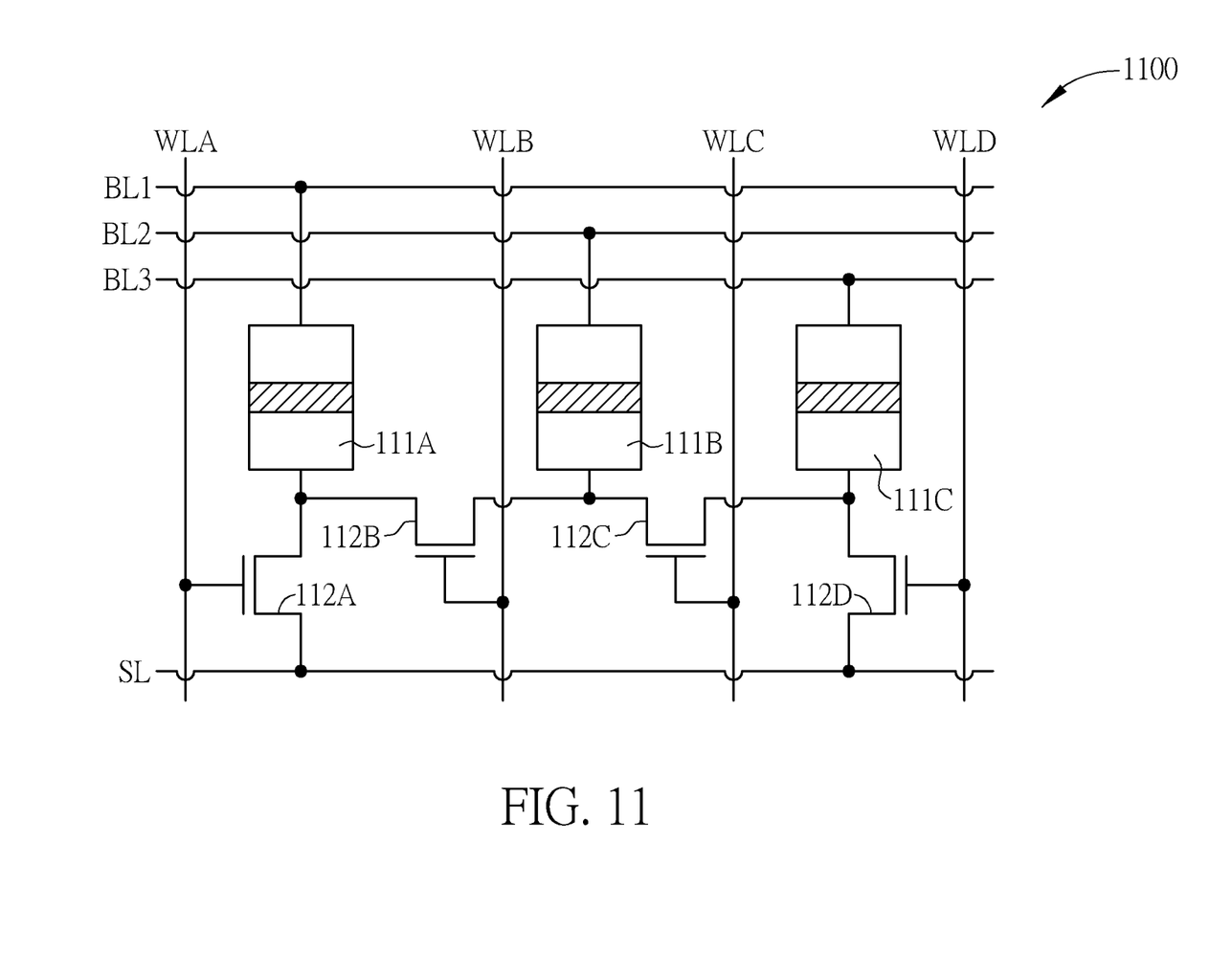
FIG. 11 illustrates a memory with a 4T3M structure.

FIG. 11 illustrates a memory with a 4T3M structure according to an embodiment. The memory 1100 may include three non-volatile cells 111A, 111B and 111C, four transistors 112A, 112B, 112C and 112D, three bit lines BL1 to BL3 and a source line SL. The couplings among the non-volatile cells and the transistors may be as shown in FIG. 11. For example, a first terminal of the first transistor 112A may be coupled to the second terminal of the first non-volatile cell 111A. A first terminal of the second transistor 112B may be coupled to a second terminal of the second non-volatile cell 111B and a second terminal of the transistor 112B may be coupled to the first terminal of the transistor 112A. Similarly, a first terminal of the third transistor 112C may be coupled to a second terminal of the third non-volatile cell 111C. A first terminal of the fourth transistor 112D may be coupled to the second terminal of the third non-volatile cell 111C. In the memory 1100, four word lines WLA, WLB, WLC and WLD may be used to respectively control the four transistors 112A, 112B, 112C and 112D, and the four transistors 112A, 112B, 112C and 112D may be used to control currents flowing through the three non-volatile cells 111A, 111B and 111C. As described above, the memory 1100 may have a 4T3M structure. In other words, FIG. 11 shows an nT(n−1)M structure where n=4.

Figure 12:
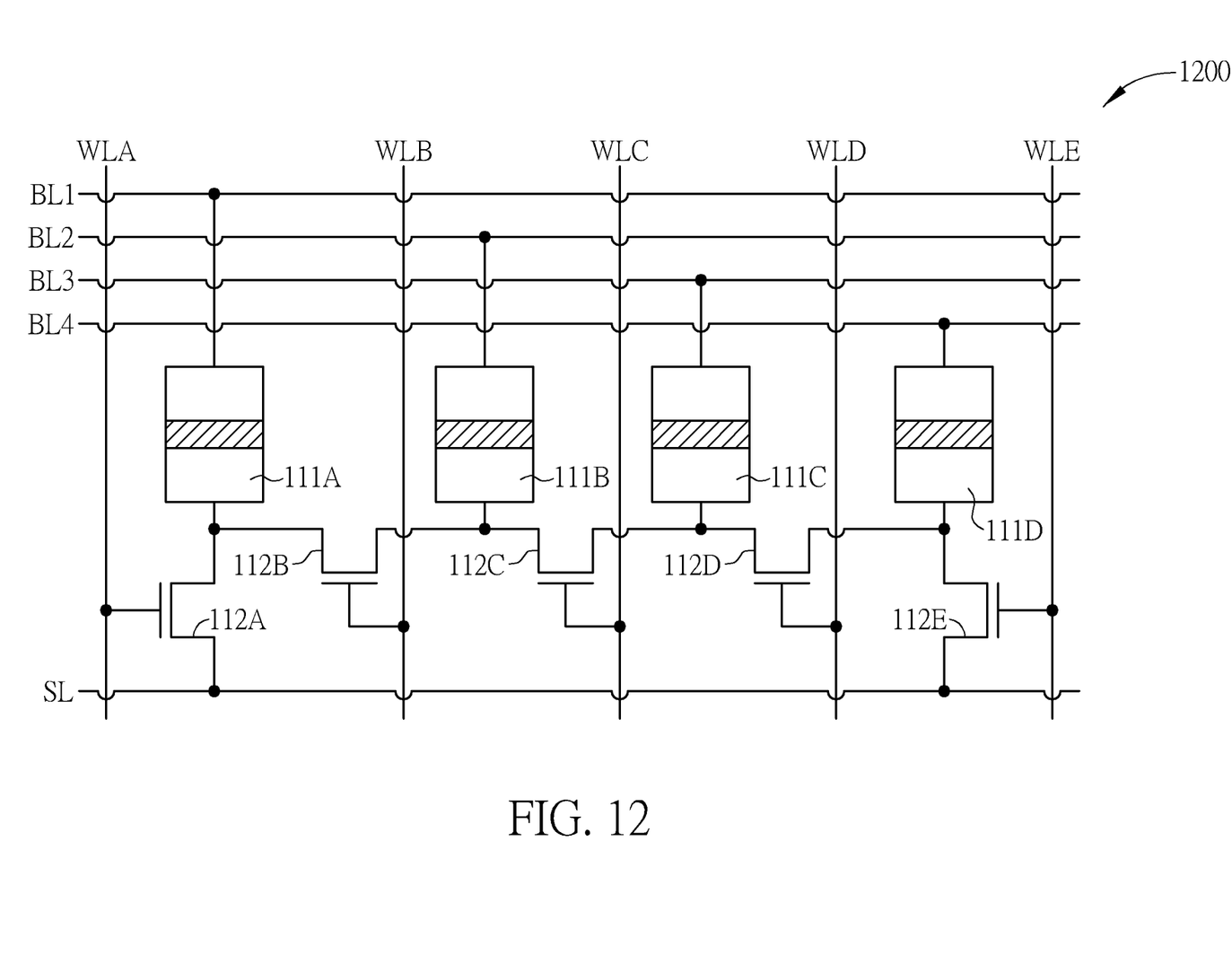
FIG. 12 illustrates a memory with a 5T4M structure.

FIG. 12 illustrates a memory 1200 according to an embodiment. The memory 1200 may include fourth non-volatile cells 111A, 111B, 111C and 110D, five transistors 112A, 112B, 112C, 112D and 112E, four bit lines BL1 to BL4 and a source line SL. The couplings among the non-volatile cells and the transistors may be as shown in FIG. 12. In the memory 1200, five word lines WLA, WLB, WLC, WLD and WLE may be used to respectively control the five transistors 112A, 112B, 112C, 112D and 112E, and the five transistors 112A, 112B, 112C, 112D and 112E may be used to control currents flowing through the three non-volatile cells 111A, 111B, 111C and 111D. As described above, the memory 1100 may have a 5T4M structure. In other words, FIG. 12 shows an nT(n−1)M structure where n=5.

In summary, a memory provided by an embodiment may have a larger driving current, a smaller area and a better scalability, so the memory can be more applicable regarding the development of manufacture process. In addition, a plurality of types of non-volatile cells are usable in the memory. Hence, a memory provided by an embodiment can improve the structure of memory and reduce problems in the field.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory comprising:
 (n−1) first non-volatile cells each comprising a first terminal and a second terminal;
 (n−1) bit lines wherein an ith bit line of the (n−1) bit lines is coupled to a first terminal of an ith first non-volatile cell of the (n−1) first non-volatile cells; and
 a first current driving circuit comprising n first transistors coupled to the (n−1) first non-volatile cells;
 (n−1) second non-volatile cells each comprising a first terminal and a second terminal; and
 a second current driving circuit comprising n second transistors coupled to the (n−1) second non-volatile cells;
 wherein the ith bit line is further coupled to a first terminal of an ith second non-volatile cell of the (n−1) second non-volatile cells, n and i are positive integers, n>2, and i<n.

2. The memory of claim 1, wherein the (n−1) first non-volatile cells are (n−1) magnetic tunnel junction cells, (n−1) resistive random-access memory cells, or (n−1) phase-change cells.

3. The memory of claim 1, wherein:
 each of the n first transistors comprises a first terminal, a second terminal and a control terminal; and
 a first terminal of an ith first transistor of the n first transistors is coupled to a second terminal of the ith first non-volatile cell.

4. The memory of claim 1, wherein a predetermined voltage is applied to the ith bit line, and the first current driving circuit is operated for a predetermined current to flow through the ith first non-volatile cell to access the ith first non-volatile cell.

5. The memory of claim 4, wherein the predetermined current has a higher value when the ith first non-volatile cell is being written and a lower value when the ith first non-volatile cell is being read.

6. The memory of claim 1, wherein the n second transistors are turned off when one of the (n−1) first non-volatile cells is being accessed.

7. A memory comprising:
 a first non-volatile cell comprising a first terminal and a second terminal;
 a second non-volatile cell comprising a first terminal and a second terminal;
 a first bit line coupled to the first terminal of the first non-volatile cell;
 a second bit line coupled to the first terminal of the second non-volatile cell;
 a first transistor comprising a first terminal coupled to the second terminal of the first non-volatile cell, a second terminal, and a control terminal;
 a second transistor comprising a first terminal coupled to the second terminal of the second non-volatile cell, a second terminal, and a control terminal; and
 a third transistor comprising a first terminal coupled to the first terminal of the first transistor, a second terminal coupled to the first terminal of the second transistor, and a control terminal.

8. The memory of claim 7, wherein the second terminal of the first transistor and the second terminal of the second transistor are coupled to a source line.

9. The memory of claim 7, wherein the control terminal of the first transistor is coupled to a first word line, the control terminal of the second transistor is coupled to a second word line, and the control terminal of the third transistor is coupled to a third word line.

10. The memory of claim 7, wherein:
 a predetermined voltage is applied to the first bit line; and
 at least one of the first transistor, the second transistor and the third transistor is turned on to access the first non-volatile cell.

11. The memory of claim 10, wherein the second bit line is floated to not access the second non-volatile cell.

12. The memory of claim 7 further comprising:
 a third non-volatile cell comprising a first terminal coupled to the first bit line and a second terminal;

a fourth non-volatile cell comprising a first terminal coupled to the second bit line and a second terminal;
a fourth transistor comprising a first terminal coupled to the second terminal of the third non-volatile cell, a second terminal, and a control terminal;
a fifth transistor comprising a first terminal coupled to the second terminal of the fourth non-volatile cell, a second terminal, and a control terminal; and
a sixth transistor comprising a first terminal coupled to the first terminal of the fourth transistor, a second terminal coupled to the first terminal of the fifth transistor, and a control terminal.

13. The memory of claim 12, wherein the fourth transistor, the fifth transistor and the sixth transistor are turned off when one of the first non-volatile cell and the second non-volatile cell is being accessed.

14. The memory of claim 7, wherein the first non-volatile cell and the second non-volatile cell are two magnetic tunnel junction cells, two resistive random-access memory cells, or two phase-change cells.

15. A memory comprising:
an oxide diffusion layer;
a polysilicon layer formed above the oxide diffusion layer;
a first metal layer formed above the oxide diffusion layer;
a first non-volatile cell disposed above the oxide diffusion layer and on a first reference line;
a second non-volatile cell disposed above the oxide diffusion layer and on a second reference line in parallel with the first reference line; and
a second metal layer formed above the first non-volatile cell and the second non-volatile cell.

16. The memory of claim 15, wherein a first terminal and a second terminal of each of transistors of the memory are formed on the oxide diffusion layer, word lines of the memory are formed on the polysilicon layer, a source line of the memory is formed on the first metal layer, and a first bit line and a second bit line are formed on the second metal layer.

17. The memory of claim 16, further comprising:
a first via formed between the second metal layer and the first non-volatile cell and configured to electrically connect the first bit line and the first non-volatile cell; and
a second via formed between the second metal layer and the second non-volatile cell and configured to electrically connect the second bit line and the second non-volatile cell.

18. The memory of claim 15, further comprising
a third non-volatile cell disposed above the oxide diffusion layer and on the first reference line; and
a fourth non-volatile cell disposed above the oxide diffusion layer and on the second reference line.

19. The memory of claim 15, wherein the first non-volatile cell and the second non-volatile cell are two magnetic tunnel junction cells, two resistive random-access memory cells, or two phase-change cells.

* * * * *